(12) United States Patent
Jeong et al.

(10) Patent No.: US 9,263,521 B2
(45) Date of Patent: Feb. 16, 2016

(54) INTEGRATED CIRCUIT DEVICES INCLUDING FINFETS AND METHODS OF FORMING THE SAME

(71) Applicant: Samsung Electronics Co., Ltd., Suwon-si, Gyeonggi-do (KR)

(72) Inventors: Yeong-Jong Jeong, Yongin-si (KR); Jeong-Yun Lee, Yongin-si (KR); Shi Li Quan, Suwon-si (KR); Dong-Suk Shin, Yongin-si (KR); Si-Hyung Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/713,349

(22) Filed: May 15, 2015

(65) Prior Publication Data

US 2015/0249130 A1 Sep. 3, 2015

Related U.S. Application Data

(63) Continuation of application No. 14/491,044, filed on Sep. 19, 2014, now Pat. No. 9,034,700.

(30) Foreign Application Priority Data

Nov. 21, 2013 (KR) .................. 10-2013-0142211

(51) Int. Cl.
| | |
|---|---|
| *H01L 29/08* | (2006.01) |
| *H01L 29/417* | (2006.01) |
| *H01L 29/78* | (2006.01) |
| *H01L 29/66* | (2006.01) |
| *H01L 27/08* | (2006.01) |
| *H01L 27/092* | (2006.01) |
| *H01L 27/088* | (2006.01) |

(52) U.S. Cl.
CPC ........ *H01L 29/0847* (2013.01); *H01L 27/0886* (2013.01); *H01L 27/092* (2013.01); *H01L 27/0924* (2013.01); *H01L 29/41758* (2013.01); *H01L 29/66636* (2013.01); *H01L 29/66795* (2013.01); *H01L 29/66818* (2013.01); *H01L 29/7851* (2013.01)

(58) Field of Classification Search
CPC .............. H01L 27/0886; H01L 27/092; H01L 27/0924; H01L 29/0847; H01L 29/41758; H01L 29/7851; H01L 29/66795
See application file for complete search history.

(56) References Cited

U.S. PATENT DOCUMENTS

| | | | |
|---|---|---|---|
| 7,279,774 | B2 | 10/2007 | Seo et al. |
| 8,178,911 | B2 | 5/2012 | Hwang et al. |

(Continued)

FOREIGN PATENT DOCUMENTS

| | | |
|---|---|---|
| KR | 1020060029434 | 4/2006 |
| KR | 1020090110679 | 10/2009 |

*Primary Examiner* — Thanhha Pham
(74) *Attorney, Agent, or Firm* — Myers Bigel Sibley & Sajovec, P.A.

(57) ABSTRACT

Integrated circuit devices including Fin field effect transistors (finFETs) and methods of forming those devices are provided. The methods may include forming a fin on a substrate and forming a gate line on the fin. The method may also include forming a first recess in the fin having a first width and a first depth and forming a second recess in the first recess having a second width that is less than the first width and having a second depth that is greater than the first depth. The method may further include forming a source/drain region in the first and second recesses.

13 Claims, 22 Drawing Sheets

(56) References Cited

U.S. PATENT DOCUMENTS

| | | |
|---|---|---|
| 8,264,021 B2 | 9/2012 | Lai et al. |
| 8,362,575 B2 | 1/2013 | Kwok et al. |
| 8,367,498 B2 | 2/2013 | Chang et al. |
| 8,378,414 B2 | 2/2013 | Miller et al. |
| 8,927,353 B2 | 1/2015 | Hsu et al. |
| 2012/0012932 A1* | 1/2012 | Perng et al. .................. 257/347 |
| 2013/0020640 A1 | 1/2013 | Chen et al. |
| 2013/0026539 A1 | 1/2013 | Tang et al. |

* cited by examiner

INTEGRATED CIRCUIT DEVICES INCLUDING FINFETS AND METHODS OF FORMING THE SAME

CROSS-REFERENCE TO RELATED APPLICATION

This application is a continuation of U.S. patent application Ser. No. 14/491,044, filed Sep. 19, 2014, which claims priority from Korean Patent Application No. 10-2013-0142211, filed on Nov. 21, 2013, in the Korean Intellectual Property Office, the disclosures of which are hereby incorporated herein by reference in their entirety.

BACKGROUND

Present inventive concepts generally relate to the field of electronics, and more particular to integrated circuit devices.

Integrated circuit devices, such as semiconductor devices, have been developed to perform high-speed operation at low voltage. Further, manufacturing processes of integrated circuit devices have been developed to increase integration of the devices.

Manufacturing processes that increase integration of integrated circuit devices including field effect transistors (FETs), however, may cause a short channel effect. Fin field effect transistors (finFETs) that include non-planar channels have been developed to reduce a short channel effect.

SUMMARY

A semiconductor device may include a semiconductor substrate, a fin formed on the semiconductor substrate and a gate line formed in a direction that crosses the fin. The device may also include a first recess region, which is formed not to overlap with the gate line in the fin and has a first width as its maximum width, and a second recess region, which is formed not to overlap with the gate line, is formed on a lower portion of the first recess region in the fin and has a second width that may be different from the first width as its maximum width. The device may further include a source/drain region formed to fill the first and second recess regions.

According to various embodiments, the first width may be wider than the second width.

According to various embodiments, the width of the second recess region may become wider as going from a lower portion to an upper portion thereof.

In various embodiments, the width of the first recess region may become wider as going from a lower portion to an upper portion thereof.

According to various embodiments, corner portions of the first and second recess regions may have curved surfaces.

In various embodiments, the first and second recesses may have a rectangular shape, and the first width may be wider than the second width.

In various embodiments, the first recess region may have a rectangular shape, the second recess region may have a triangular shape, and the first width and the second width may be equal to each other.

A method for fabricating a semiconductor device may include forming a fin on a substrate and forming a gate line crossing the fin on the substrate. The method may also include forming a first recess in the fin at a side of the gate line and forming a second recess in the first recess. The first recess may have a first width as a maximum width and may not overlap with the gate line. The second recess may have a second width as a maximum width that may be different from the first width and may not overlap with the gate line. The method may further include forming a source/drain region in the first and second recesses.

In various embodiments, the second width may be less than the first width.

According to various embodiments, forming the first and second recesses may include performing respective anisotropic etching processes.

According to various embodiments, the method may also include forming a passivation layer on an inner sidewall of the first recess prior to forming the second recess.

In various embodiments, the method may include removing the passivation layer after forming the second recess and prior to forming the source/drain region.

In various embodiments, the passivation layer may include SiN, SiO2, HfO, AlO, TiN, TiO, Cr or AlN.

According to various embodiments, forming the first recess may include sequentially performing an anisotropic etching process and an isotropic etching process.

In various embodiments, forming the second recess may include performing an anisotropic etching process.

A method of forming an integrated circuit device may include forming a fin extending in a first direction on a substrate and forming a gate structure on the fin. The gate structure may extend in a second direction that is different from the first direction. The method may also include forming a first recess in the fin at a side of the gate structure and forming a second recess in the first recess. The first recess may have a first width in the first direction and may have a first depth relative to an upper surface of the fin. The second recess may have a second width in the first direction that may be less than the first width and may have a second depth relative to the upper surface of the fin that may be greater than the first depth. The method may further include forming a source/drain pattern in the first and second recesses.

According to various embodiments, the second depth may be less than a height of the fin relative to an upper surface of the substrate.

In various embodiments, the first depth may be less than the first width.

According to various embodiments, the method may also include forming an isolation layer surrounding a first portion of the fin and extending between the substrate and the gate structure. The fin may protrude from the substrate in a third direction that is substantially perpendicular to the first direction, and a second portion of the fin that is exposed by the isolation layer may have a thickness in the third direction that may be greater than the first depth.

In various embodiments, the thickness of the second portion of the fin may be greater than the second depth.

In various embodiments, a first horizontal distance between the side of the gate structure and the first recess may be greater than a second horizontal distance between the side of the gate structure and the second recess.

According to various embodiments, the second recess may have a variable width decreasing with a depth the second recess.

In various embodiments, the method may include forming a passivation layer on an inner surface of the first recess prior to forming the second recess.

According to various embodiments, the passivation layer may include SiN, SiO2, HfO, AlO, TiN, TiO, Cr or AlN.

According to various embodiments, forming the first recess may include performing a first anisotropic etching process, and forming the second recess may include performing a second anisotropic etching process.

According to various embodiments, forming the source/drain pattern in the first and second recesses may include epitaxially growing the source/drain pattern.

In various embodiments, the source/drain pattern may include a stress material.

DETAILED DESCRIPTION

Figure 1:
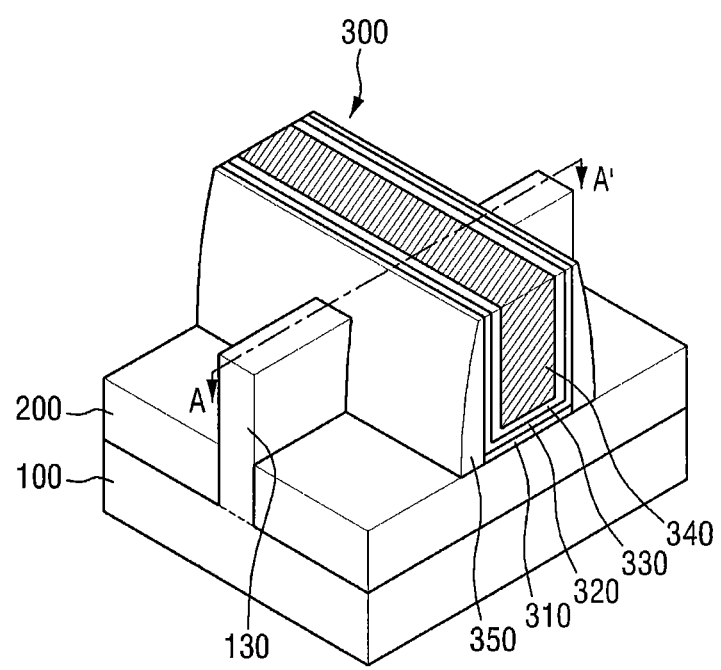
FIG. 1 is a perspective view illustrating a finFET.

Example embodiments will be described with reference to the accompanying drawings. Many different forms and embodiments are possible without deviating from the spirit and teachings of this disclosure and so the disclosure should not be construed as limited to the example embodiments set forth herein. Rather, these embodiments are provided so that this disclosure will be thorough and complete and will fully convey the scope of the disclosure to those skilled in the art. Like reference numbers refer to like elements throughout. In the drawings, the sizes and relative sizes of layers and regions may be exaggerated for clarity.

It will be understood that when an element is referred to as being "on" another element, it can be directly on the other element, or intervening elements may also be present. In contrast, when an element is referred to as being "directly on" another element, there are no intervening elements present. As used herein the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the embodiments. As used herein, the singular forms "a," "an" and "the" are intended to include the plural forms as well, unless the context clearly indicates otherwise. It will be further understood that the terms "comprising," "having," "including," and "containing," when used in this specification, specify the presence of the stated features, steps, operations, elements, and/or components, but do not preclude the presence or addition of one or more other features, steps, operations, elements, components, and/or groups thereof.

Unless otherwise defined, all terms including technical and scientific terms used herein have the same meaning as commonly understood by one of ordinary skill in the art to which this invention belongs. It will be understood that all terms used herein are intended merely to better illuminate present inventive concepts and are not a limitation on the scope of present inventive concepts. Further, It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Example embodiments of present inventive concepts will be described herein with reference to perspective views, cross-sectional views and/or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of present inventive concepts should not be construed as limited to the particular shapes illustrated herein but may include deviations in shapes that result, for example, from manufacturing.

It will be understood that although the terms first, second, etc. may be used herein to describe various elements, these elements should not be limited by these terms. These terms are only used to distinguish one element from another. Thus, a first element could be termed a second element without departing from the teachings of present inventive concepts.

Integrated circuit devices, for example, semiconductor devices, and methods of forming those devices according to some embodiments of present inventive concepts may secure a process margin by reducing defects and may thus improve a yield of manufacturing processes of those devices. Specifically, the integrated circuit devices may include a recess having a modified profile at a lower portion thereof. The recess may be formed in a fin and a source/drain region may be formed in the recess in subsequent processes.

As appreciated by the present inventors, a source/drain region formed in a recess, which has a "U" shape and is formed in a fin, may contact a gate line when a distance (i.e., proximity) between the gate line and the recess is about 11 nm or less. Accordingly, manufacturing processes may need to secure a distance between the gate line and the recess of about 13 nm or greater. In integrated circuit devices according to some embodiments of present inventive concepts, a recess may have a modified profile at a lower portion thereof and defects caused by shorts between the gate line and the source/drain region may thus be prevented or reduced even though when a distance between the gate line and the recess is about 13 nm or less.

Figure 2:
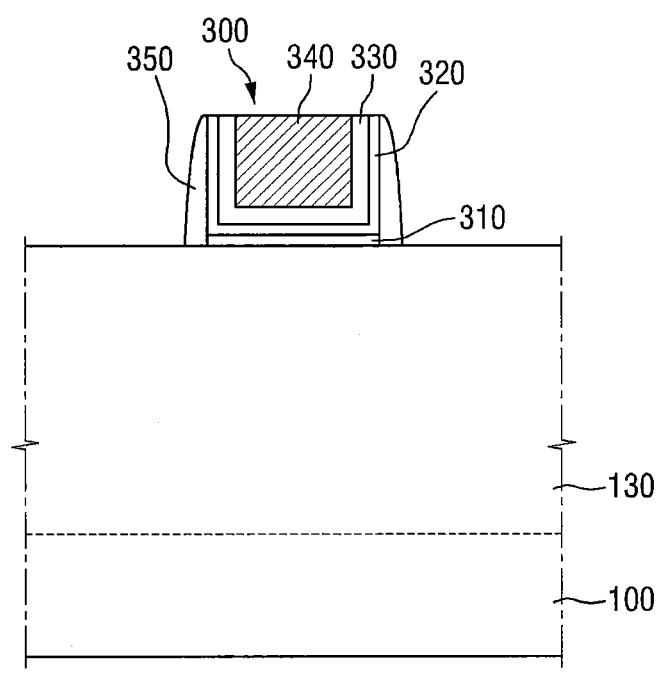
FIG. 2 is a cross-sectional view taken along the line A-A' of FIG. 1.

FIG. 1 is a perspective view illustrating a finFET, and FIG. 2 is a cross-sectional view taken along the line A-A' of FIG. 1.

Referring to FIGS. 1 and 2, a finFET may include a substrate 100, an isolation layer pattern 200, a fin 130, and a gate line 300.

The substrate 100 may include semiconductor material. The substrate 100 may be a rigid substrate, for example, a silicon substrate, an SOI (Silicon On Insulator) substrate, a gallium arsenide substrate, a silicon germanium substrate, a ceramic substrate, a quartz substrate, or a glass substrate. In some embodiments, the substrate 100 may be a flexible plastic substrate including, for example, polyimide, polyester, polycarbonate, polyethersulfone, polymethylmethacrylate, polyethylene naphthalate, or polyethyleneterephthalate.

The isolation layer pattern 200 may be formed on the substrate 100 to define an active region and may be used for device isolation. The isolation layer pattern 200 may include an insulating layer, for example, an HDP oxide layer, an SOG oxide layer, or a CVD oxide layer, but the isolation layer pattern 200 is not limited thereto.

The fin 130 may be formed on the substrate 100 and may protrude from the substrate 100 in a third direction Z1. The fin 130 may extend in a second direction Y1 that is substantially perpendicular to the third direction Z1. The fin 130 may be a part of the substrate 100 or may include an epitaxial layer that is grown from the substrate 100 using an epitaxial growth process. The fin 130 may include semiconductor material. The isolation layer pattern 200 may cover an upper surface of the substrate 100 and a side surface of the fin 130.

The gate line 300 may cross the fin 130 and may cover a portion of the fin 130. The gate line 300 may extend in a first direction X1. The gate line 300 may include an interface layer pattern 310, a gate insulating layer pattern 320, a work function adjustment layer pattern 330 and a gate metal pattern 340, which are sequentially formed on the fin 130. The gate line 300 may also include a gate spacer 350.

The interface layer pattern 310 may be formed on the isolation layer pattern 200 and the fin 130. The interface layer pattern 310 may serve to prevent or reduce an inferior interface between the isolation layer pattern 200 and the gate insulating layer pattern 320. The interface layer pattern 310 may include a low-k material layer, which has a dielectric constant k equal to or lower than 9. For example, the interface layer pattern 310 may include a silicon oxide layer (dielectric constant k is about 4) or a silicon oxynitride layer (dielectric constant k is in a range of about 4 to about 8 depending on contents of oxygen and nitrogen). In some embodiments, the interface layer pattern 310 may be made of silicate or may be made of a combination of the above listed layers/materials.

The gate insulating layer pattern 320 may be formed on the interface layer pattern 310. In some embodiments, the gate insulating layer pattern 320 may be formed on the isolation layer pattern 200 and the fin 130 without an intervening interface layer pattern 310. The gate insulating layer pattern 320 may include a high-k material. The gate insulating layer pattern 320 may include, for example, HfSiON, HFO$_2$, ZrO$_2$, Ta$_2$O$_5$, TiO$_2$, SrTiO$_3$, BaTiO$_3$, and/or SrTiO$_3$. The gate insulating layer pattern 320 may be formed to have a proper thickness depending on types of devices. In some embodiments, the gate insulating layer pattern 320 may be HfO$_2$ and may have a thickness equal to or less than 50 Å (Angstroms), but not limited thereto. For example, the gate insulating layer pattern 320 including HfO$_2$ may have a thickness in a range of about 5 Å to about 50 Å.

The work function adjustment layer pattern 330 may be formed on the gate insulating layer pattern 320. The work function adjustment layer pattern 330 may contact the gate insulating layer pattern 320. The work function adjustment layer pattern 330 may be used to provide work function adjustment. The work function adjustment layer pattern 330 may include, for example, metal nitride. For example, the work function adjustment layer pattern 330 may include Mo, Pd, Ru, Pt, TiN, WN, TaN, Ir, TaC, RuN, TiAl, TaAlC, TiAlN, MoN, or combination thereof. In some embodiments, the work function adjustment layer pattern 330 may be a TiN layer or a double layer including a lower TiN layer and an upper TaN layer, but the work function adjustment layer pattern 330 is not limited thereto.

A capping layer may be formed between the gate insulating layer pattern 320 and the work function adjustment layer pattern 330. The capping layer may be used to provide the work function adjustment. Specifically, the capping layer may be used as a buffer between the gate insulating layer pattern 320 and the work function adjustment layer pattern 330 such that work function may be adjusted more precisely in comparison to a case where only the work function adjustment layer pattern 330 is used without the capping layer. The capping layer may include, for example, LaO, GdO, DyO, SrO, BaO, aluminum oxide, aluminum metal oxide, or combination thereof, but the capping layer is not limited thereto.

The gate metal pattern 340 may be formed on the work function adjustment layer pattern 330. The gate metal pattern 340 may contact the work function adjustment layer pattern 330 as illustrated in FIG. 1. The gate metal pattern 340 may be formed in a space defined by the work function adjustment layer pattern 330. In some embodiments, the gate metal pattern 340 may fill the space defined by the work function adjustment layer pattern 330. The gate metal pattern 340 may include a conductive material, for example, W or Al, but the gate metal pattern 340 is not limited thereto.

The gate spacer 350 may be formed on at least one side surface of the gate metal pattern 340. The gate spacer 350 may include a nitride layer, an oxynitride layer, a low-k insulation layer or a combination thereof. It is illustrated that the gate spacer 350 has a curved side surface, but present inventive concepts, are not limited thereto. It will be understood that the shape of the gate spacer 350 may have various shapes. For example, the gate spacer 350 may have an "I" shape or an "L" shape. Further, the gate spacer 350 is illustrated as a single layer, but present inventive concepts are not limited thereto. In some embodiments, the gate spacer 350 may be formed as a multilayer stack.

Figure 3:
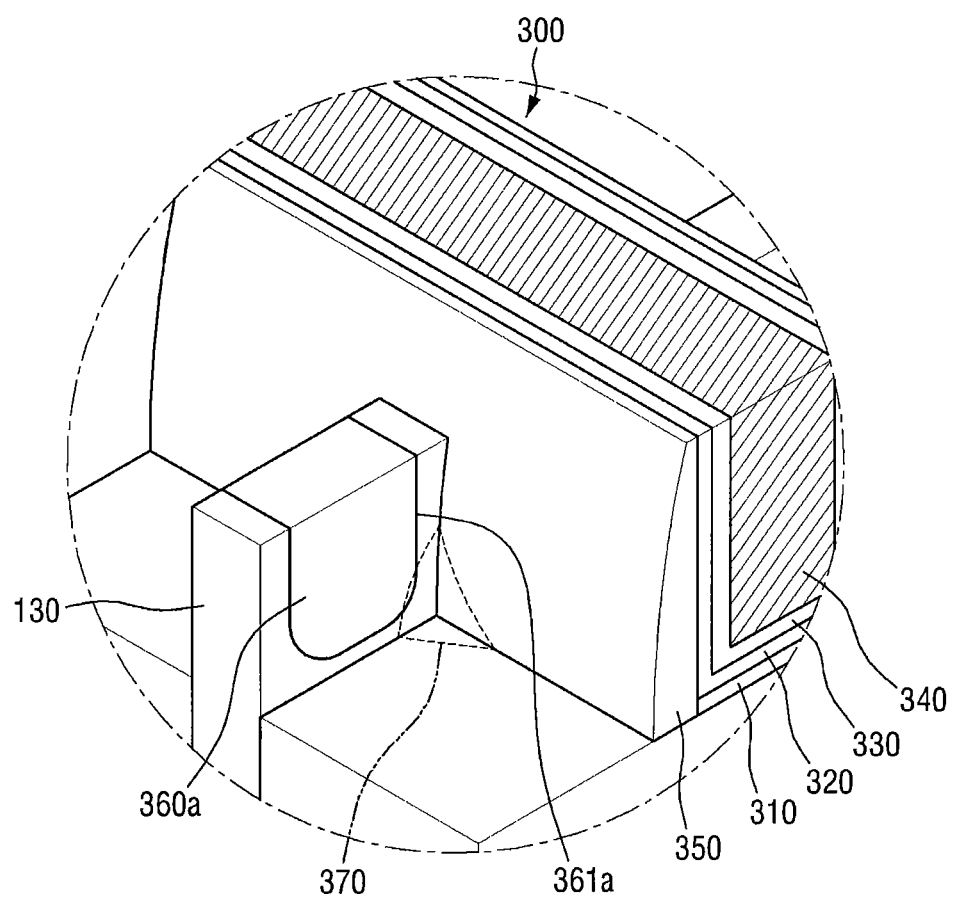
FIGS. 3 and 4 are a perspective view and a cross-sectional view respectively illustrating a defect in a semiconductor device including a finFET.
Figure 4:
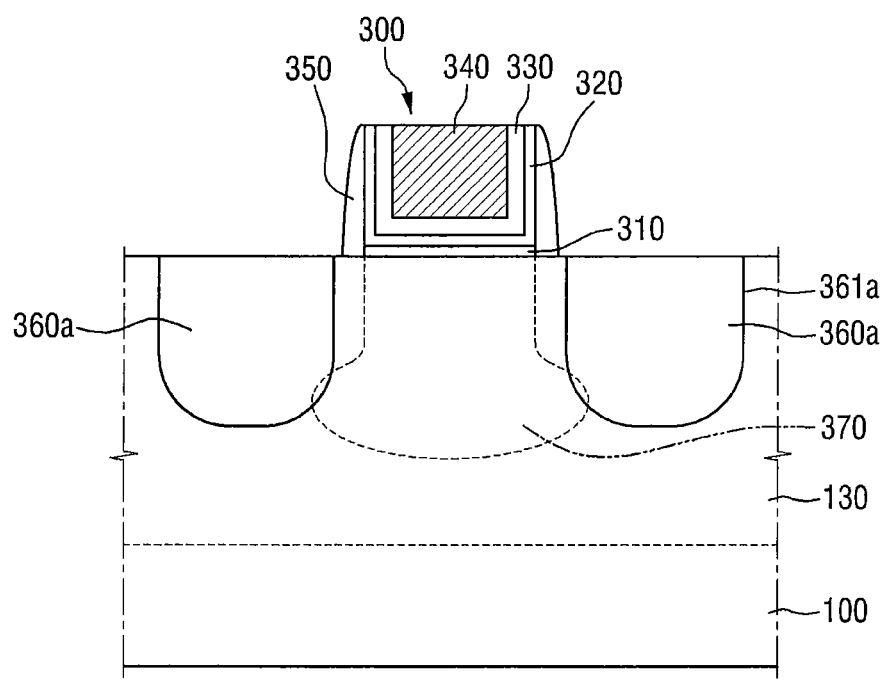

FIGS. 3 and 4 are a perspective view and a cross-sectional view respectively illustrating a defect in a semiconductor device including a finFET.

Referring to FIGS. 3 and 4, a semiconductor device including a finFET may have a recess region 361a formed in the fin 130 and the recess region 361a may have a "U" shape. As appreciated by the present inventors, the gate line 300 may include a lower portion 370 including a material, for example polysilicon, which is not completely removed and thus remains in an area where the fin 130 contacts the gate line 300. The source/drain region 360a may be formed in the recess region 361a using an epitaxial growth process and the source/drain region 360a may have a "U" shape because of a "U" shape of the recess region 361a. As illustrated in FIG. 3, there may be shorts between the lower portion of the gate line 370 and a lower portion of the source/drain region 360a and may thus cause defects. It will be understood that when a distance between the gate line 300 and the source/drain region 360a is equal to or less than 13 nm, those defects may limit increase in integration of the semiconductor device.

Figure 5:
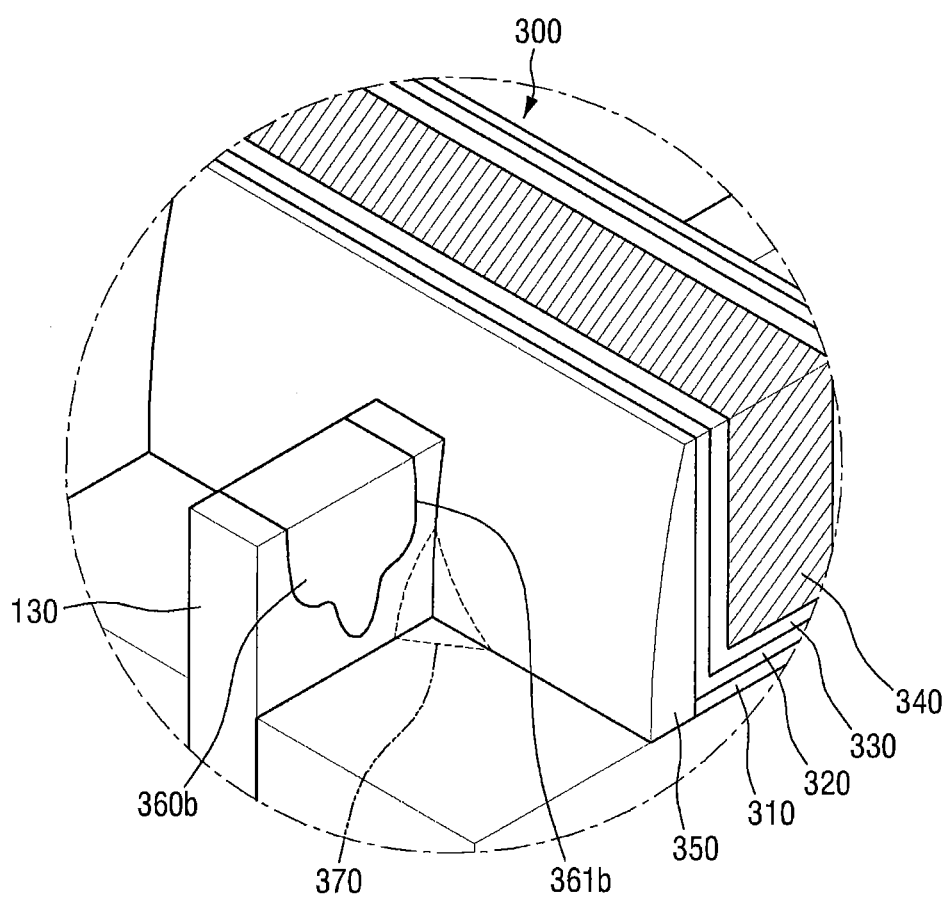
FIGS. 5 and 6 are a perspective view and a cross-sectional view respectively illustrating a semiconductor device including a finFET according to some embodiments of present inventive concepts.
Figure 6:
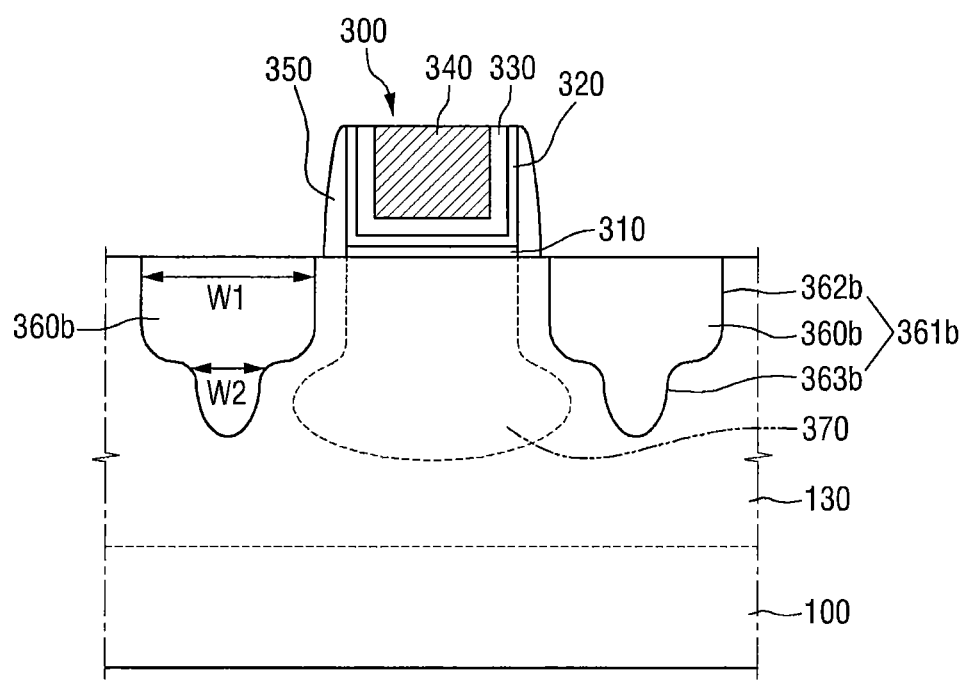

FIGS. 5 and 6 are a perspective view and a cross-sectional view respectively illustrating a semiconductor device including a finFET according to some embodiments of present inventive concepts.

Referring to FIGS. 5 and 6, a semiconductor device including a finFET may have a recess region 361b that is formed in the fin 130 and may have a lower portion having a shape modified from a "U" shape. The semiconductor device may include a substrate 100, a fin 130, a gate line 300, a first recess region 362b, a second recess region 363b, and a source/drain region 360b. The substrate 100 may include semiconductor material.

The substrate 100, the fin 130, and the gate line 330 may be substantially the same as or similar to those discussed with reference to FIGS. 1 and 2. The recess region 361b may include the first recess region 362b and the second recess region 363b. The recess region 361b may be formed using etching processes.

The first recess region 362b may be formed in the fin 130 and may not overlap with (e.g., laterally overlap with) the gate line 300. A maximum width of the first recess region 362b may be a first width W1. The second recess region 363b may be formed not to overlap with the gate line 300 and may be formed at a lower portion of the first recess region 362b. A maximum width of the second recess region 363b may be a second width W2. It will be understood that a "width" of the first and second recess regions 362b and 363b may refer to a width in a direction that the fin 130 extends. The first width W1 and the second width W2 may be different. For example, the first width W1 may be greater than the second width W2.

In some embodiments, the first recess region 362b may be formed using a first etching process and the second recess region 363b may be formed using a second etching process such that the first recess region 362b and the second recess region 363b may thus have different maximum widths. In some embodiments, the first recess region 362b and the second recess region 363b may be formed using an in-situ process. Widths of the first recess region 362b and the second recess region 363b may become wider as going from a lower portion to an upper portion thereof. Widths of the first recess region 362b and the second recess region 363b may decrease with a depth of the recess 361b. The first recess region 362b and the second recess region 363b may have curved corner portions.

The first recess region 362b and the second recess region 363b may be formed not to overlap with the gate line 300 and defects caused by shorts between the lower portion of the gate line 370 and the source/drain region 360b may thus be prevented or reduced. Specifically, the source/drain region 360b may be formed in the first recess region 362b and the second recess region 363b. In some embodiments, the source/drain region 360b may fill the first recess region 362b and the second recess region 363b. Therefore, the first and second recess regions 362b and 363b that are formed not to overlap with the gate line 300 in the fin 130 may effectively prevent or reduce defects caused by shorts between the lower portion of the gate line 370 and the source/drain region 360b. Further, the second recess region 363b that is formed at the lower portion of the first recess region 362b may have a width less than the width of the first recess region 362b, and defects caused by shorts between the lower portion of the gate line 370 and the source/drain region 360b may thus be prevented or reduced. In some embodiments, the recess region 361b may have a paint brush shape (e.g., the shape illustrated in FIG. 6.)

Referring to FIG. 6, the gate line 300 and the recess region 361b may be spaced apart from each other in a horizontal direction (e.g., a direction substantially parallel to an upper surface of the substrate 100.) A horizontal distance between a side of the gate line 300 and the first recess region 362b may be greater than a horizontal distance between the side of the gate line 300 and the second recess region 363c.

The source/drain region 360b may be formed in the fill the first recess region 362b and the second recess region 363b. In some embodiments, the source/drain region 360b may be formed to fill the first recess region 362b and the second recess region 363b. The source/drain region 360b may be formed by doping source/drain material while growing an epitaxial layer in the first recess region 362b and the second recess region 363b using an epitaxial growth process. In some embodiments, the source/drain region 360b may be formed by injecting the source/drain material using an ion injection process after growing an epitaxial layer in the first recess region 362b and the second recess region 363b.

The source/drain region 360b may be formed on at least one side of the gate line 300 and may be formed in the fin 130. The source/drain region 360a and the gate line 300 may be insulated from each other by the gate spacer 350. In some embodiments, a silicide layer may be formed on the source/drain region 360b and a contact may be formed on the silicide layer. The silicide layer may be formed between the source/drain region 360b and the contact and may serve to reduce surface resistance and/or contact resistance.

The source/drain region 360b may include a compressive stress material when the gate line 300 is a gate line of a PMOS transistor. The compressive stress material may be a material having a lattice constant greater than a lattice constant of a material included in the substrate 100. For example, the substrate may include Si and the compressive stress material may be SiGe. The compressive stress material may improve mobility of carriers of a channel region by applying compressive stress to the fin 130. The source/drain region 360b may include a tensile stress material when the gate line 300 is a gate line of an NMOS transistor. The tensile stress material may include a material having a lattice constant equivalent to or less than a lattice constant of a material included in the substrate 100. For example, the substrate 100 may include Si and the source/drain region 360b may include Si or SiC that has a lattice constant less than a lattice constant of Si.

Figure 7:
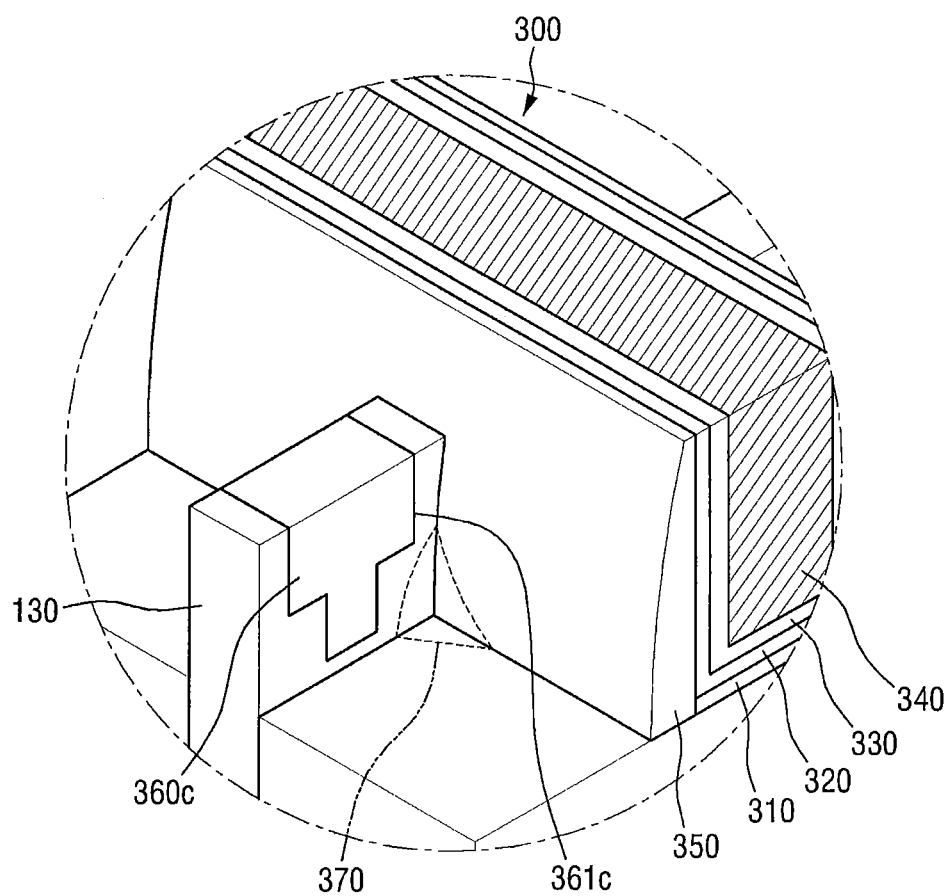
FIGS. 7 and 8 are a perspective view and a cross-sectional view respectively illustrating a semiconductor device including a finFET according to some embodiments of present inventive concepts.
Figure 8:
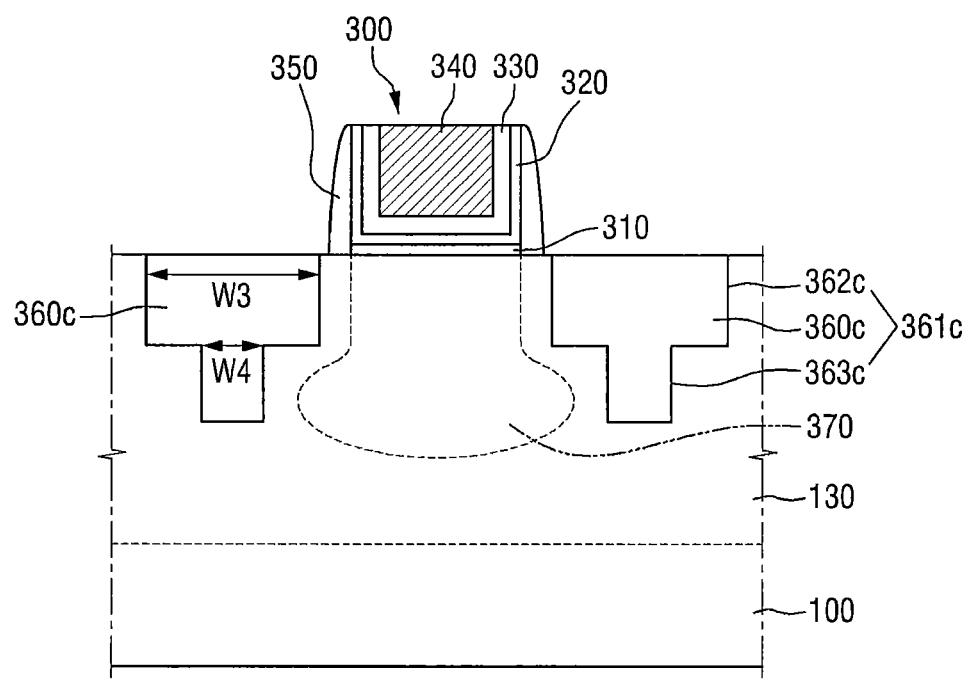

FIGS. 7 and 8 are a perspective view and a cross-sectional view respectively illustrating a semiconductor device including a finFET according to some embodiments of present inventive concepts.

Referring to FIGS. 7 and 8, a semiconductor device including a finFET may include a first recess region 362c and a second recess region 363c, and each of the first recess region 362c and the second recess region 363c may have a rectangular shape. A first width W3 of the first recess region 362c may be wider than a second width W4 of the second recess region 363c.

The first recess region 362c and the second recess region 363c may be formed not to overlap with the gate line 300 and defects caused by shorts between the lower portion of the gate line 370 and the source/drain region 360c may thus be prevented or reduced. The second recess region 363c formed at a lower portion of the first recess region 362c may have the second width W4 less than the first width W3 of the first recess region 362c, and defects caused by shorts between the lower portion of the gate line 370 and the source/drain region 360c may thus be prevented or reduced. In some embodiments, the recess region 361c may have a hammer shape (e.g., the shape illustrated in FIG. 8.)

Figure 9:
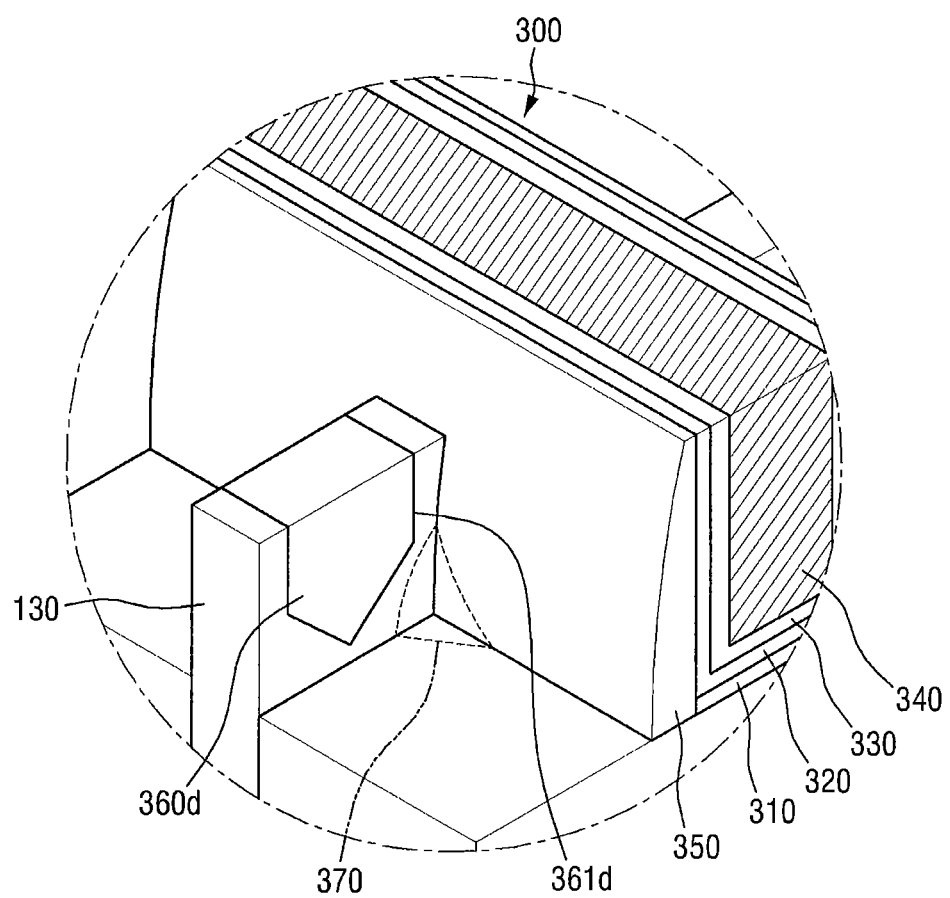
FIGS. 9 and 10 are a perspective view and a cross-sectional view respectively illustrating a semiconductor device including a finFET according to some embodiments of present inventive concepts.
Figure 10:
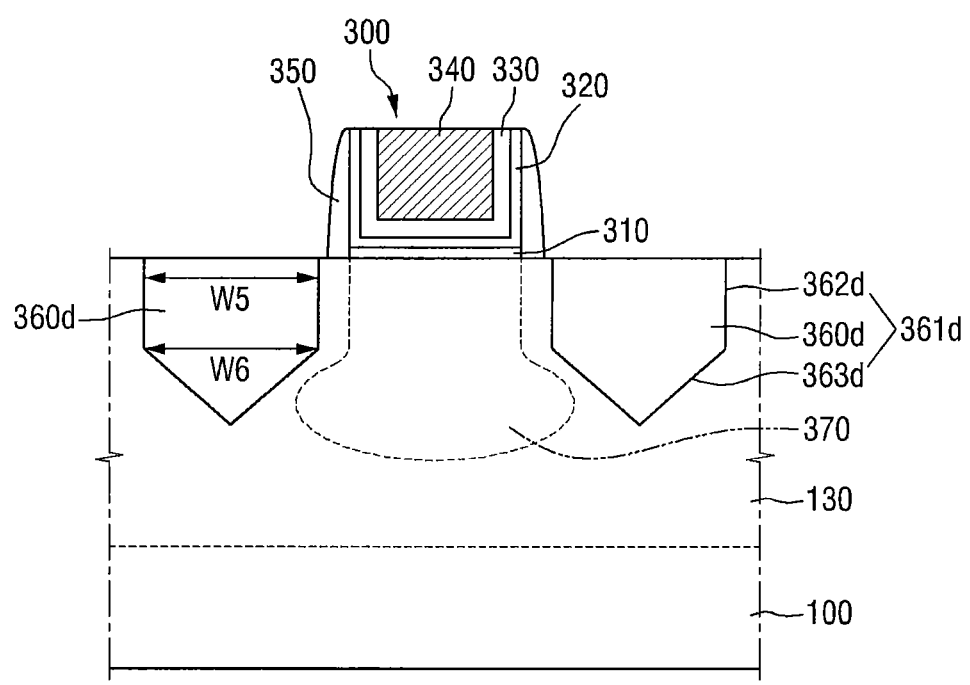

FIGS. 9 and 10 are a perspective view and a cross-sectional view respectively illustrating a semiconductor device including a finFET according to some embodiments of present inventive concepts.

Referring to FIGS. 9 and 10, a semiconductor device including a finFET may have a first recess region 362d and a second recess region 363d. The first recess region 362d may have a rectangular shape and the second recess region 363d may have a triangular shape. A first width W5 of the first recess region 362d may be substantially the same as or similar to a second width W6 of the second recess region 363d. The second recess region 363d may have a triangular shape and a width of the second recess region 363d may thus become narrower as going from an upper portion to a lower portion thereof. The width of the second recess region 363d may decrease with a depth of the second recess region 363d.

The first recess region 362d and the second recess region 363d may be formed not to overlap with the gate line 300, and defects caused by shorts between the lower portion of the gate line 370 and the source/drain region 360d may thus be prevented or reduced. Further, the second recess region 363d may be formed at a lower portion of the first recess region 362d and a width of the second recess region 363d may become narrower as going from an upper portion to a lower portion thereof. Therefore, defects caused by shorts between the lower portion of the gate line 370 and the source/drain region 360d may thus be prevented or reduced. In some embodiments, the recess region 361d may have a pen point shape (e.g., the shape illustrated in FIG. 10.)

A semiconductor device according to some embodiments of present inventive concepts will be described with reference to FIGS. 11 to 13.

Figure 11:
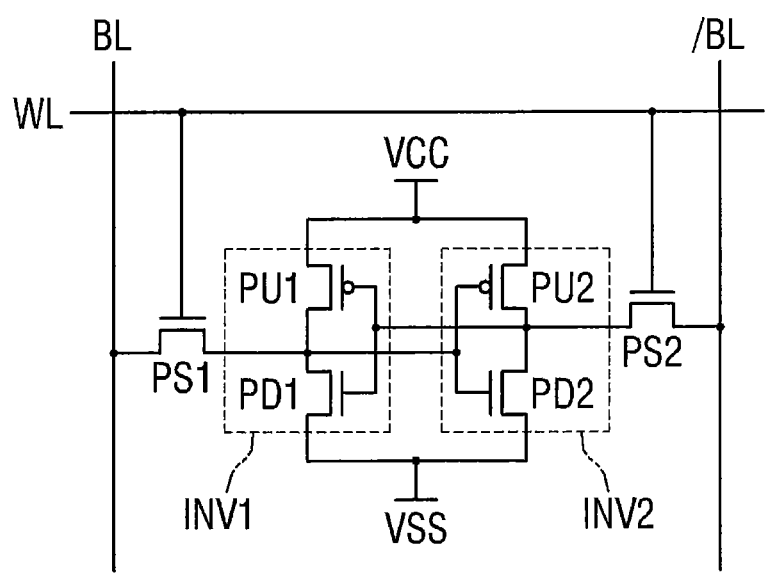
FIG. 11 is a circuit diagram of a semiconductor device according to some embodiments of present inventive concepts.

FIG. 11 is a circuit diagram of a semiconductor device according to some embodiments of present inventive concepts. FIGS. 12 and 13 are layouts of a semiconductor device according to some embodiments of present inventive concepts. Semiconductor devices according to some embodiments of present inventive concepts may be applied to all apparatuses including general logic devices and FIGS. 11, 12 and 13 illustrate a Static random-access memory (SRAM) as an example.

Referring to FIG. 11, a semiconductor device according to some embodiments of present inventive concepts may include a pair of inverters INV1 and INV2 connected in parallel between a power supply node Vcc and a ground node Vss. A first path transistor PS1 and a second pass transistor PS2 may be connected to output nodes of the respective inverters INV1 and INV2. The first pass transistor PS1 and the second pass transistor PS2 may be connected to a bit line BL and a complementary bit line /BL, respectively. Gates of the first pass transistor PS1 and the second pass transistor PS2 may be connected to a word line WL.

The first inverter INV1 may include a first pull-up transistor PU1 and a first pull-down transistor PD1, which are connected in series, and the second inverter INV2 may include a second pull-up transistor PU2 and a second pull-down transistor PD2. Each of the first pull-up transistor PU1 and the second pull-up transistor PU2 may be a PMOS transistor, and each of the first pull-down transistor PD1 and the second pull-down transistor PD2 may be a NMOS transistor.

The first inverter INV1 and the second inverter INV2 may constitute one latch circuit in a manner that an input node of the first inverter INV1 is connected to an output node of the second inverter INV2, and an input node of the second inverter INV2 is connected to an output node of the first inverter INV1.

Figure 12:
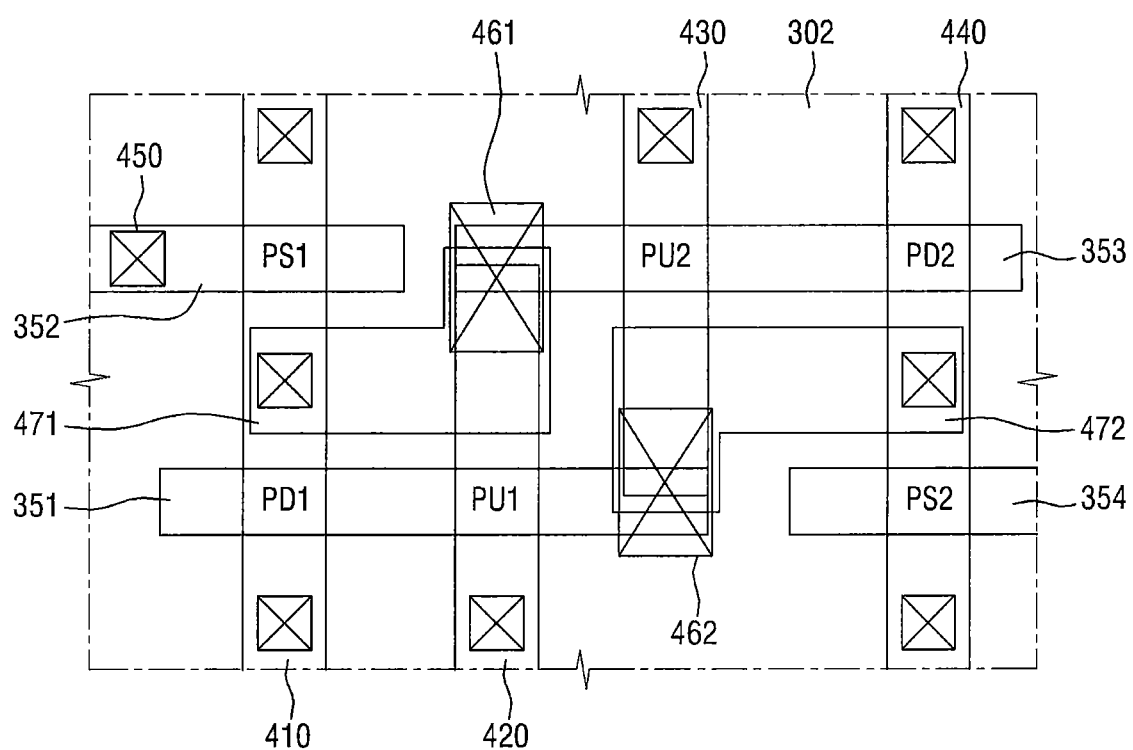
FIGS. 12 and 13 are layouts of a semiconductor device according to some embodiments of present inventive concepts.
Figure 13:
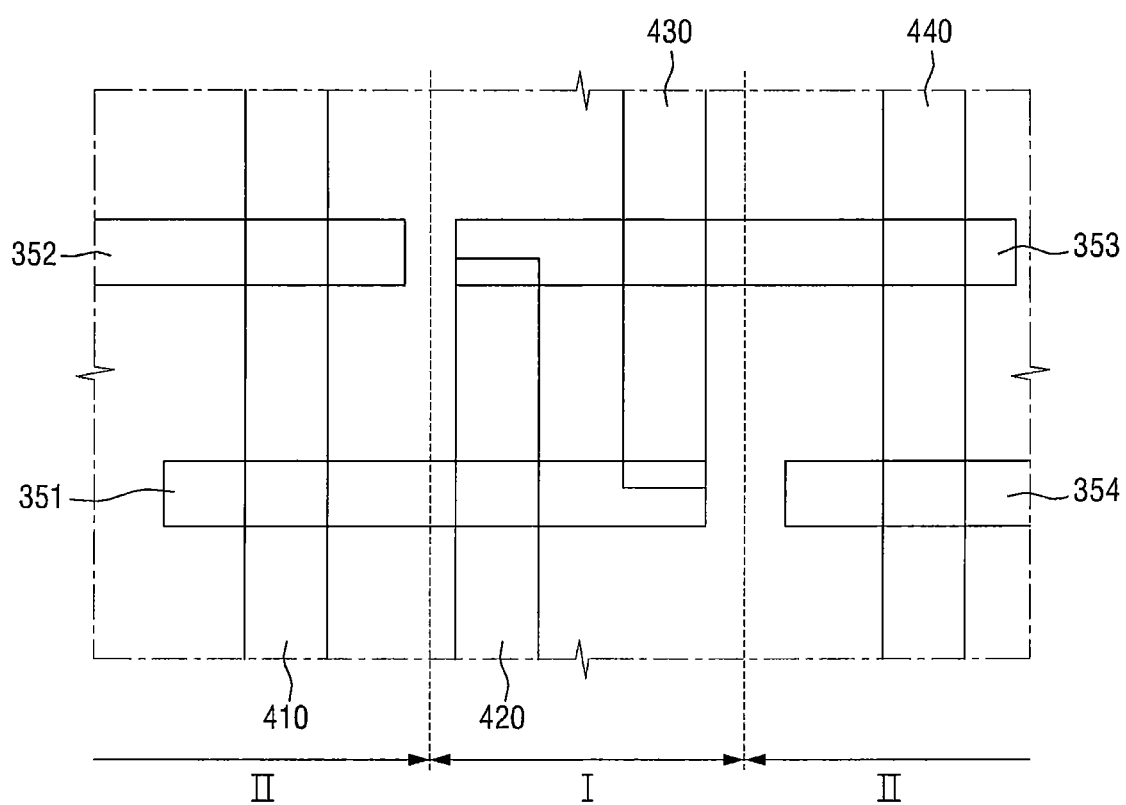

Referring to FIGS. 11, 12 and 13, a first fin 410, a second fin 420, a third fin 430, and a fourth fin 440, which are spaced apart from one another, may be formed to extend in a first direction, for example, a vertical direction of FIG. 12. In some embodiments, lengths of the second fin 420 and the third fin 430 in the first direction may be shorter than lengths of the first fin 410 and the fourth fin 440 in the first direction.

A first gate line 351, a second gate line 352, a third gate line 353, and a fourth gate line 354 may extend in a second direction, for example, a horizontal direction of FIG. 12, and may be formed to cross the first through fourth fins 410, 420, 430 and 440. Specifically, the first gate line 351 may be formed to entirely overlap with the first fin 410 and the second fin 420 in the first direction and may be formed to partially overlap with the third fin 430 in the first direction. Stated in other words, the first gate line 351 may overlap with only an edge portion of the third fin 430. The third gate line 353 may be formed to entirely overlap with the fourth fin 440 and the third fin 430 in the first direction and may be formed to partially overlap with the second fin 420 in the first direction. The third gate line 353 may overlap with only an edge portion of the second fin 420. The second gate line 352 and the fourth gate line 354 may be formed to entirely overlap with the respective first fin 410 and fourth fin 440 in the first direction.

As illustrated in FIG. 12, the first pull-up transistor PU1 may be defined around a region where the first gate line 351 and the second fin 420 cross each other, the first pull-down transistor PD1 may be defined around a region where the first gate line 351 and the first fin 410 cross each other, and the first pass transistor PS1 may be defined around a region where the second gate line 352 and the first fin 410 cross each other. The second pull-up transistor PU2 may be defined around a region where the third gate line 353 and the third fin 430 cross each other, the second pull-down transistor PD2 may be defined around a region where the third gate line 353 and the fourth fin 440 cross each other, and the second pass transistor PS2 may be defined around a region where the fourth gate line 354 and the fourth fin 440 cross each other.

According to some embodiments of present inventive concepts, recess regions may be formed on sides of the first to fourth gate lines 351 to 354 in the respective first to fourth fins 410 to 440, and source/drain regions may be formed in the respective recess regions. Further, contacts 450 may be formed.

In addition, a shared contact 461 connecting the second fin 420, the third gate line 353, and a wiring 471 and a shared contact 462 connecting the third fin 430, the first gate line 351, and a wiring 472 may be formed.

Each of the first pull-up transistor PU1, the first pull-down transistor PD1, the first pass transistor PS1, the second pull-up transistor PU2, the second pull-down transistor PD2, and the second pass transistor PS2 may include a finFET according to some embodiments of present inventive concepts.

Methods for forming a semiconductor device according to some embodiments of present inventive concepts will be described with reference to FIGS. 14 to 20.

FIGS. 14 to 17 are cross-sectional views illustrating intermediate structures provided in a method of forming a semiconductor device including a finFET according to some embodiments of present inventive concepts.

Figure 14:
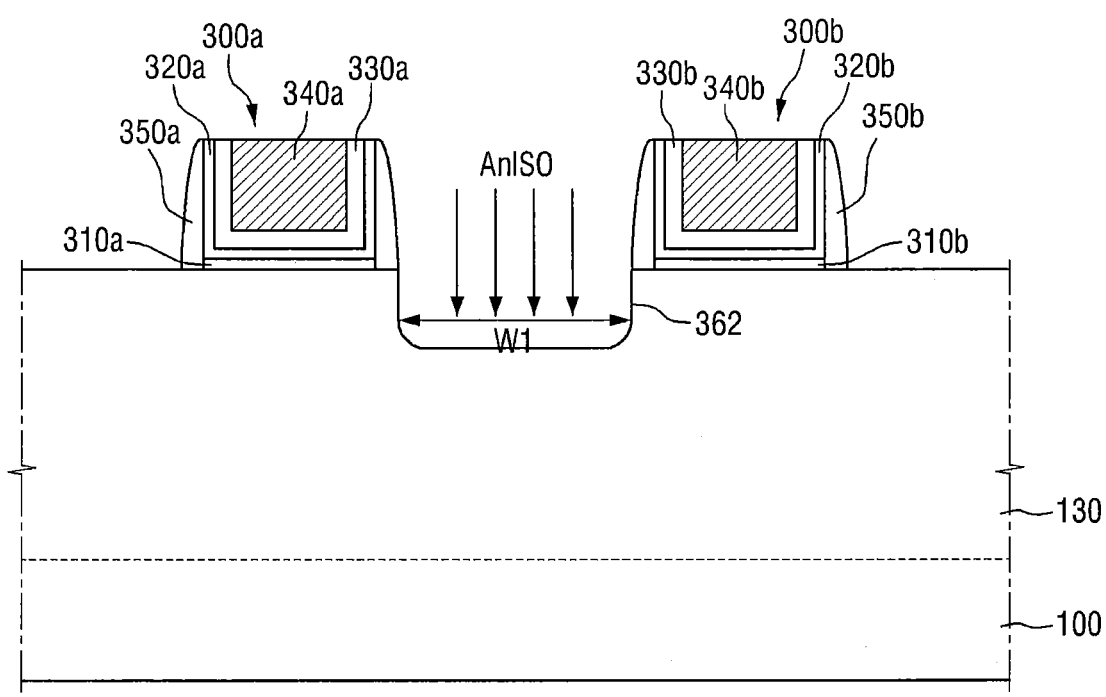
FIGS. 14 to 17 are cross-sectional views illustrating intermediate structures provided in a method of forming a semiconductor device including a finFET according to some embodiments of present inventive concepts.

Referring to FIG. 14, a fin 130 may be formed on a substrate 100. The substrate 100 may include semiconductor material. Gate lines 300a and 300b may be formed on the substrate 100 and may cross the fin 130. The gate line 300a may include an interface layer pattern 310a, a gate insulating layer pattern 320a, a work function adjustment layer pattern 330a and a gate metal pattern 340a, which are sequentially formed on the fin 130. The gate line 300a may also include a gate spacer 350a. The gate line 300b may include an interface layer pattern 310b, a gate insulating layer pattern 320b, a work function adjustment layer pattern 330b, a gate metal pattern 340b and a gate spacer 350b.

A first recess region 362, which has a first width W1 as a maximum width, may be formed in the fin 130 and may be formed not to overlap with the gate lines 300a and 300b. The first recess region 362 may be formed using an anisotropic etching process. The first recess region 362 may have a depth that is less than a width of the first recess region 362.

Figure 15:
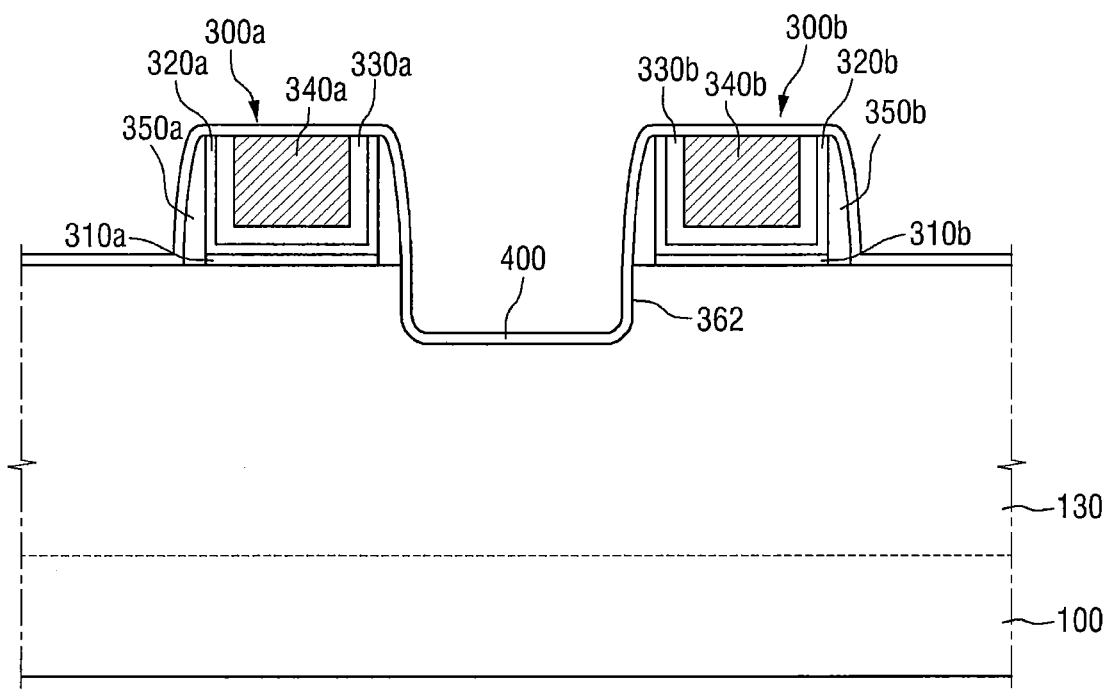

Referring to FIG. 15, a passivation layer 400 may be deposited on the substrate 100 and may cover an inner surface of the first recess region 362. The passivation layer 400 may serve to protect a sidewall of the first recess region 362 when a second recess region 363 is formed through subsequent processes. The passivation layer 400 may include SiN, SiO$_2$, HfO, AlO, TiN, TiO, Cr, or AlN.

Figure 16:
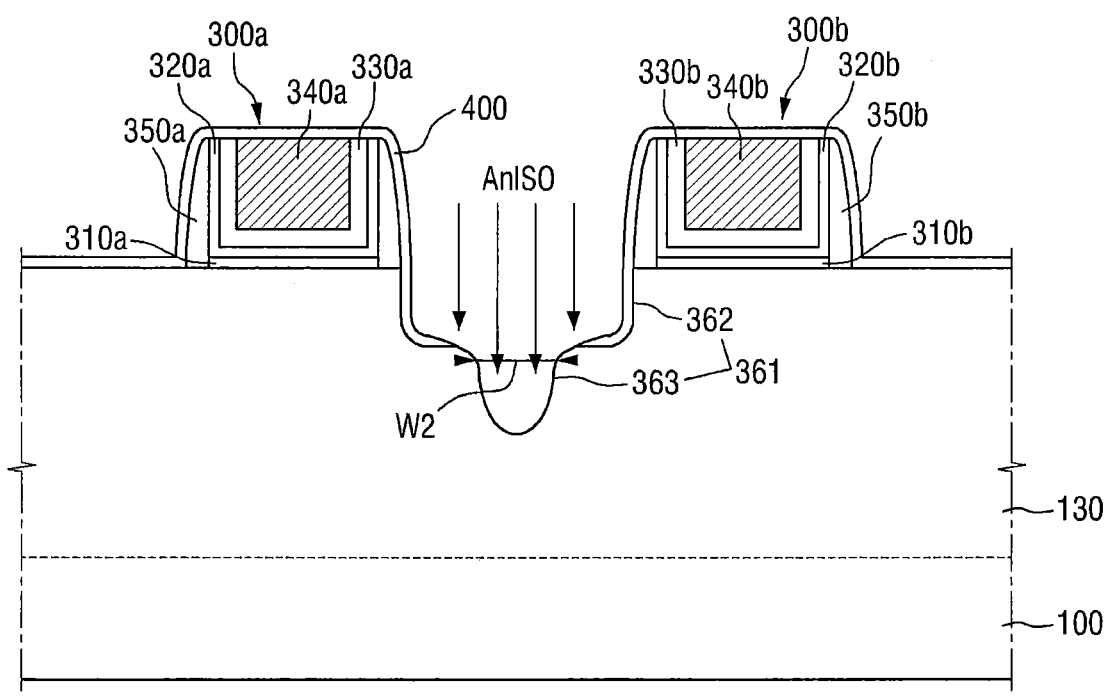

Referring to FIG. 16, the second recess region 363, which has a second width W2 as a maximum width, may be formed at a lower portion of the first recess region 362 in the fin 130 and may be formed not to overlap with the gate lines 300a and 300b. The second width W2 may be less than the first width W1. The second recess region 363 may be formed using an anisotropic etching process. The second recess region 363 may have a depth that is greater than a width of the second recess region 363.

Figure 17:
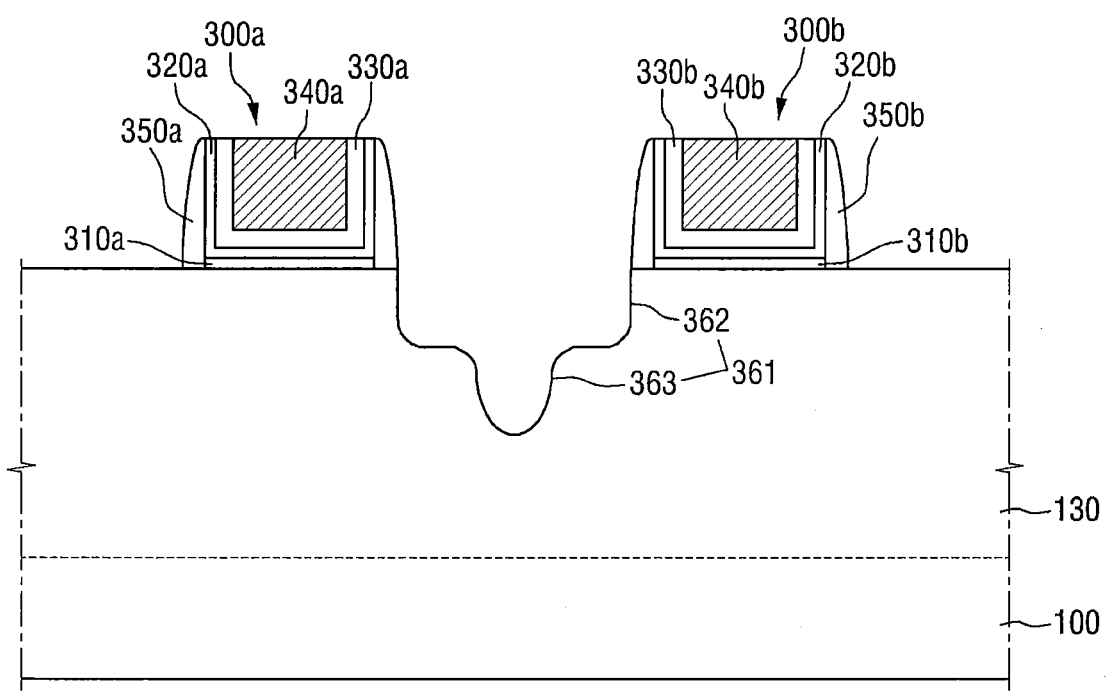

Referring to FIG. 17, the passivation layer 400 may be removed and a recess region 361 including a lower portion that has a modified profile may be formed. FIG. 17 illustrates the recess region 361 having a paint brush shape, but not limited thereto. The recess region 361 may have various shapes. In some embodiments, the recess region 361 may have a hammer shape (e.g., the shape illustrated in FIG. 8) or a pen point shape (e.g., the shape illustrated in FIG. 10). A source/drain region may be formed in the recess region 361. The source/drain region may be formed to fill the recess region 361. The source/drain region may be formed by doping source/drain material while growing an epitaxial layer in the first recess region 362 and the second recess region 363 using an epitaxial growth process. The source/drain region may be formed by injecting/implanting the source/drain material using an ion injection/implant process after growing an epitaxial layer.

Figure 18:
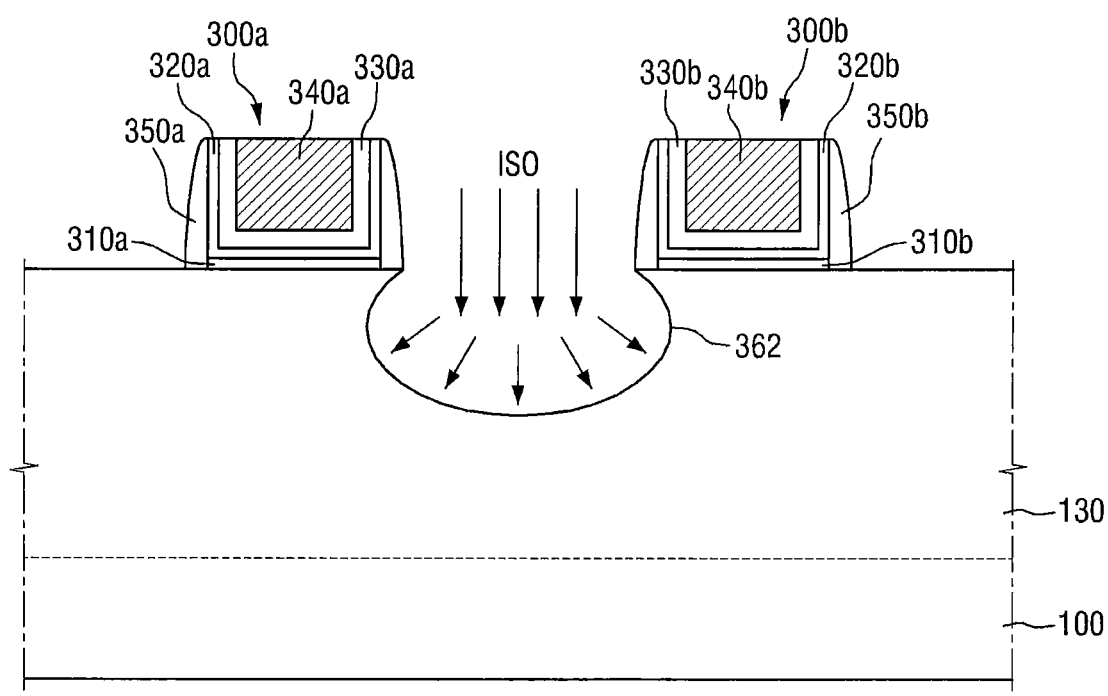
FIGS. 18 to 20 are cross-sectional views illustrating intermediate structures provided in a method of forming a semiconductor device including a finFET according to some embodiments of present inventive concepts.
Figure 19:
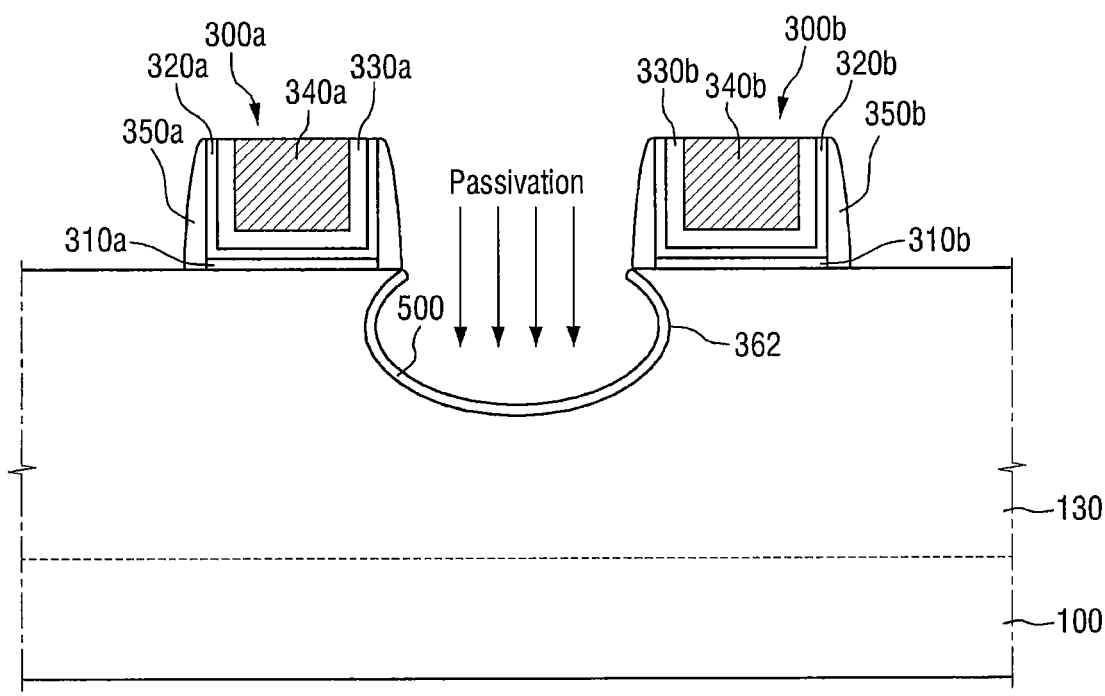
Figure 20:
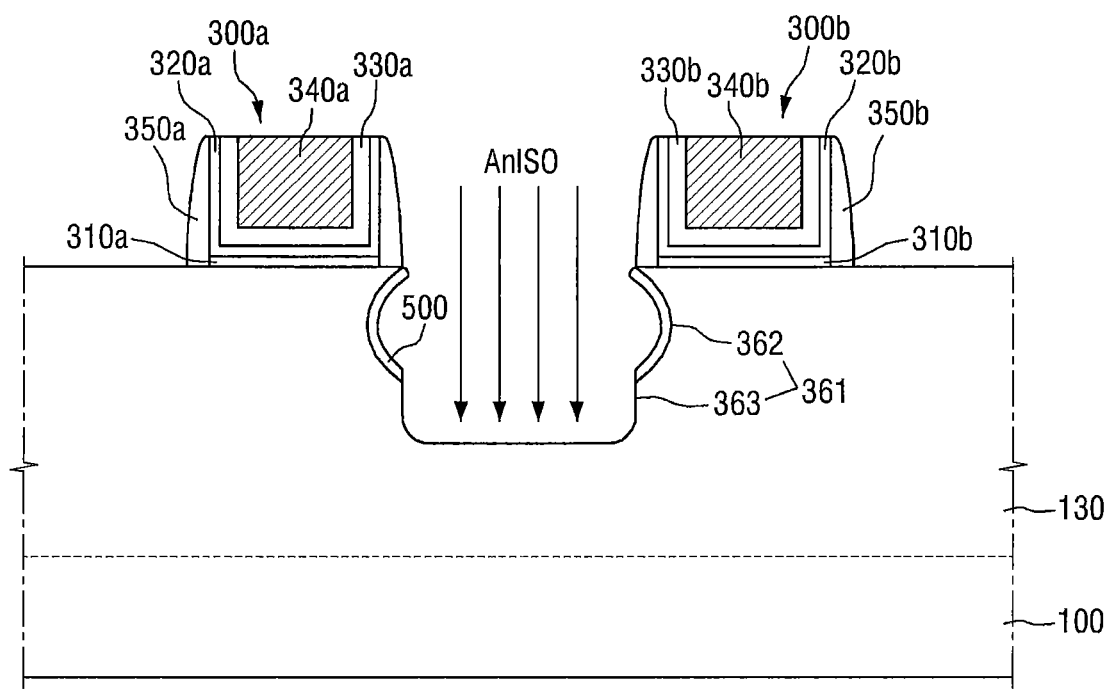

FIGS. 18 to 20 are cross-sectional views illustrating intermediate structures provided in a method of forming a semiconductor device including a finFET according to some embodiments of present inventive concepts.

Referring to FIG. 18, a first recess region 362 may be formed performing an isotropic etching process after an anisotropic etching process (e.g., the process illustrated in FIG. 14) is performed. The first recess region 362 may be preliminarily formed to have a depth that is less than a width of the first recess region 362 using an anisotropic etching process, and then the recess region 362 may be formed to have an elliptical shape using an isotropic etching process.

Referring to FIG. 19, a passivation layer 500 may be deposited to cover the interior of the first recess region 362. The passivation layer 500 may serve to protect a sidewall of the first recess region 362 when a second recess region 363 is formed in subsequent processes. The passivation layer 500 may include SiN, SiO2, HfO, AlO, TiN, TiO, Cr, or AlN.

Referring to FIG. 20, the second recess region 363 may be formed using an anisotropic etching process. In some embodiments, the passivation layer 500 may be removed after forming the second recess region 363. The source/drain region may be formed in the recess region 361. The source/drain region may fill the recess region 361.

It will be understood that methods according to some embodiments of present inventive concepts may further include forming mask layers and/or mask patterns. For example, referring to FIG. 15, a mask pattern may be formed on the passivation layer 400 to cover the gate lines 300a and 300b, an upper surface of the fin 130 and side portions of the first recess region 362 before forming the second recess so that only central portion of the first recess region 362 are exposed through the mask pattern when forming the second recess region 363 of FIG. 16.

Figure 21:
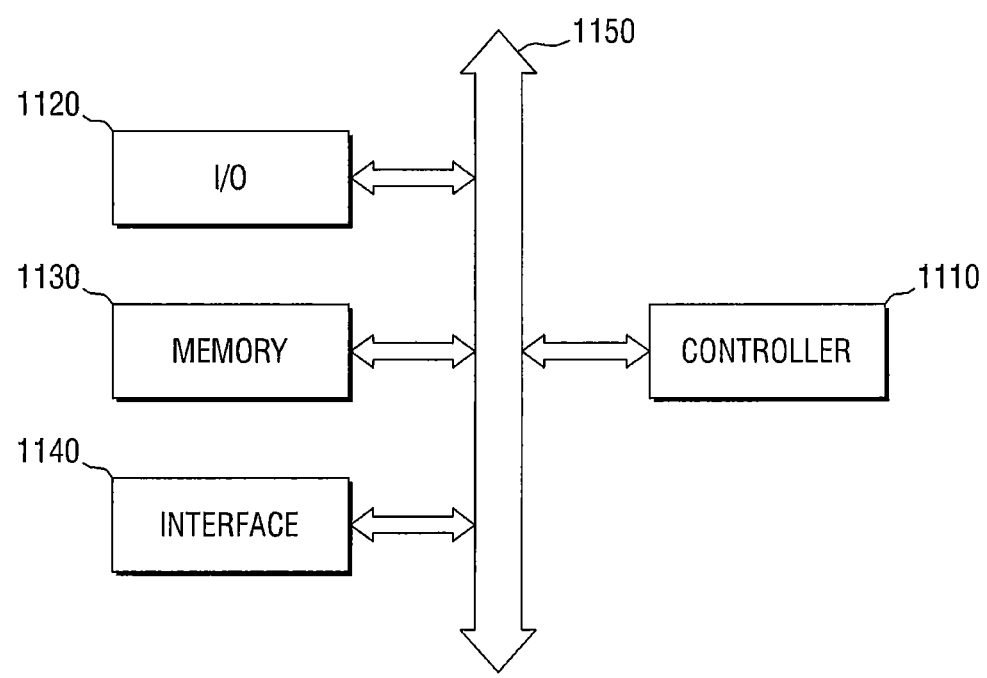
FIG. 21 is a block diagram of an electronic system including a semiconductor device according to some embodiments of present inventive concepts.

FIG. 21 is a block diagram of an electronic system including a semiconductor device according to some embodiments of present inventive concepts.

Referring to FIG. 21, an electronic system 1100 may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 may correspond to paths through which data is transferred.

The controller 1110 may include at least one of a microprocessor, a digital signal processor, a microcontroller, and logic elements that can perform similar functions. The I/O device 1120 may include a keypad, a keyboard and/or a display device. The memory 1130 may store data and/or commands. The interface 1140 may function to transfer data to a communication network or receive data from the communication network. The interface 1140 may be of a wired or wireless type. For example, the interface 1140 may include an antenna and/or a wire or wireless transceiver. In some embodiments, the electronic system 1100 may further include a high-speed DRAM and/or SRAM as an operating memory to improve operation of the controller 1110. The memory 1130, the controller 1110 and/or the I/O device 1120 may include finFETs according to some embodiments of present inventive concepts.

The electronic system 1100 may be applied to a PDA (Personal Digital Assistant), a portable computer, a web tablet, a wireless phone, a mobile phone, a digital music player, a memory card, or all electronic devices that can transmit and/or receive information in wireless environments.

Figure 22:
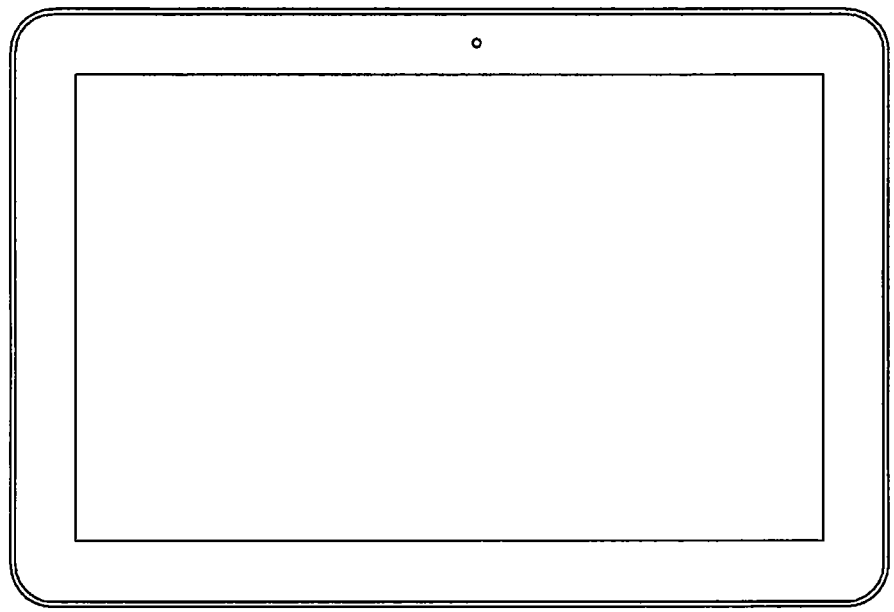
FIGS. 22 and 23 are diagrams illustrating electronic devices including a semiconductor device according to some embodiments of present inventive concepts.
Figure 23:
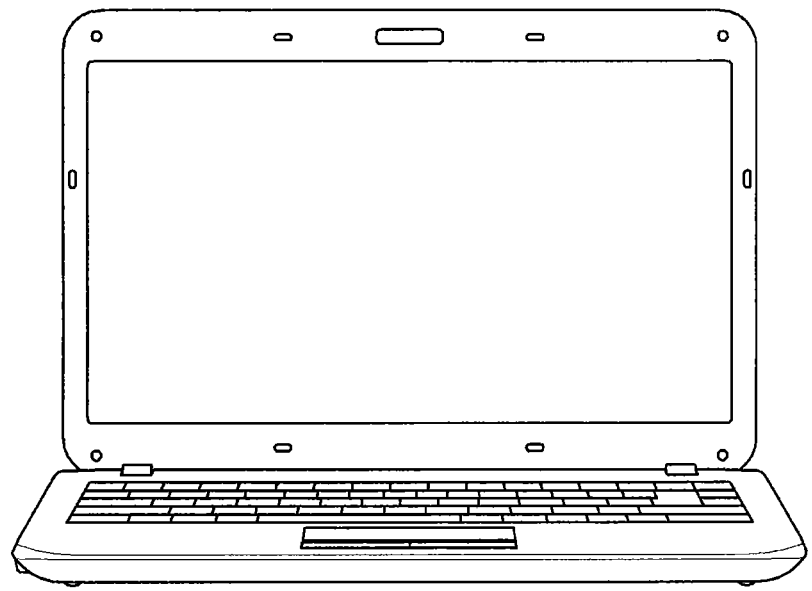

FIGS. 22 and 23 are diagrams illustrating electronic devices including a semiconductor device according to some embodiments of present inventive concepts. FIG. 22 illustrates a tablet PC, and FIG. 23 illustrates a notebook PC. The tablet PC and/or the notebook PC may include semiconductor devices according to some embodiments of present inventive concepts.

The above-disclosed subject matter is to be considered illustrative, and not restrictive, and the appended claims are intended to cover all such modifications, enhancements, and other embodiments, which fall within the true spirit and scope of present inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
    a semiconductor substrate;
    a fin protruding from an upper surface of the semiconductor substrate in a first direction, the fin extending in a second direction that is perpendicular to the first direction;
    an isolation layer on the upper surface of the semiconductor substrate and on a sidewall of a portion of the fin that is adjacent the upper surface of the semiconductor substrate;
    a gate line crossing the fin;
    a first recess region in a portion of the fin that is exposed by the gate line, wherein the first recess region has a first width as its maximum width in the second direction, and wherein a lowermost surface of the first recess region is at a level higher than an upper surface of the isolation layer relative to the upper surface of the semiconductor substrate;
    a second recess region in the portion of the fin that is exposed by the gate line and connected to a lower portion of the first recess region, wherein the second recess region has a second width as its maximum width in the second direction, and the second width is different from the first width; and
    a source/drain region in the first and second recess regions.

2. The semiconductor device of claim 1, wherein the first width is wider than the second width.

3. The semiconductor device of claim 1, wherein a width of the second recess region becomes wider as going from a lower portion to an upper portion thereof.

4. The semiconductor device of claim 3, wherein a width of the first recess region becomes wider as going from the lower portion to an upper portion thereof.

5. The semiconductor device of claim 1, wherein corner portions of the first and second recess regions have curved surfaces.

6. The semiconductor device of claim 1, wherein each of the first and second recess regions has a rectangular shape when viewed in cross section, and the first width is wider than the second width.

7. The semiconductor device of claim 1, wherein a lowermost surface of the second recess region is at a level higher than the upper surface of the isolation layer relative to the upper surface of the semiconductor substrate.

8. A semiconductor device comprising:
    a semiconductor substrate;
    a fin protruding from an upper surface of the semiconductor substrate in a first direction;
    an isolation layer on the upper surface of the semiconductor substrate and on a sidewall of a portion of the fin that is adjacent the upper surface of the semiconductor substrate;
    a gate line crossing the fin; and
    a source/drain region in a portion of the fin that is exposed by the gate line and that is adjacent a side of the gate line, wherein the source/drain region comprises a upper portion that is adjacent an upper surface of the fin and a lower portion that protrudes from a portion of the upper portion in a depth direction of the source/drain region, and
    wherein a thickness of the upper portion in the first direction is less than a distance between the upper surface of the fin and an upper surface of the isolation layer in the first direction.

9. The semiconductor device of claim 8, wherein the distance between the upper surface of the fin and the upper surface of the isolation layer in the first direction comprises a first distance, and
    wherein a second distance between the upper surface of the fin and a lowermost portion of the lower portion in the first direction is less than the first distance between the upper surface of the fin and the upper surface of the isolation layer in the first direction.

10. The semiconductor device of claim 9, wherein a third distance between the side of the gate line and a side of the upper portion of the source/drain region in a second direction is less than a fourth distance between the side of the gate line and a side of the lower portion of the source/drain region in the second direction.

11. The semiconductor device of claim 9, wherein the fin extends in a second direction that is perpendicular to the first direction, and
    wherein the upper portion of the source/drain region has a first maximum width in the second direction, and the lower portion of the source/drain region has a second maximum width in the second direction that is less than the first maximum width.

12. A semiconductor device comprising:
    a semiconductor substrate;
    a fin protruding from an upper surface of the semiconductor substrate in a first direction;
    an isolation layer on the upper surface of the semiconductor substrate and on a sidewall of a portion of the fin that is adjacent the upper surface of the semiconductor substrate;
    a gate line crossing the fin; and
    a source/drain region in a portion of the fin that is exposed by the gate line and that is adjacent a side of the gate line, wherein the source/drain region comprises a upper portion that is adjacent an upper surface of the fin and a lower portion that is connected under the upper portion,
    wherein the upper portion has a rectangular shape and comprises opposing sidewalls, and the lower portion has a triangular shape and comprises slanted sidewalls that are connected to the respective opposing sidewalls of the upper portion and converge in a depth direction of the source/drain region when viewed in cross section, and
    wherein a thickness of the upper portion of the source/drain region in the first direction is less than a first distance between the upper surface of the fin and an upper surface of the isolation layer in the first direction.

13. The semiconductor device of claim 12, wherein a second distance between the upper surface of the fin and a lowermost portion of the lower portion of the source/drain region in the first direction is less than the first distance between the upper surface of the fin and the upper surface of the isolation layer in the first direction.

* * * * *